(12) United States Patent
Brown et al.

(10) Patent No.: US 9,560,742 B2
(45) Date of Patent: Jan. 31, 2017

(54) BACKDRILL RELIABILITY ANCHORS

(71) Applicant: ALCATEL-LUCENT CANADA, INC., Ottawa (CA)

(72) Inventors: Paul J. Brown, Wakefield (CA); Alex L. Chan, Ottawa (CA)

(73) Assignee: Alcatel Lucent, Boulogne-Billancourt (FR)

( * ) Notice: Subject to any disclaimer, the term of this patent is extended or adjusted under 35 U.S.C. 154(b) by 86 days.

(21) Appl. No.: 14/580,756

(22) Filed: Dec. 23, 2014

(65) Prior Publication Data

US 2016/0135288 A1    May 12, 2016

Related U.S. Application Data

(60) Provisional application No. 62/078,150, filed on Nov. 11, 2014, provisional application No. 62/079,947, filed on Nov. 14, 2014.

(51) Int. Cl.

| | |
|---|---|
| H05K 1/11 | (2006.01) |
| H05K 1/02 | (2006.01) |
| H05K 3/46 | (2006.01) |
| G06F 17/50 | (2006.01) |
| H05K 3/42 | (2006.01) |
| H05K 3/00 | (2006.01) |

(52) U.S. Cl.
CPC ......... H05K 1/0251 (2013.01); G06F 17/5077 (2013.01); H05K 1/0271 (2013.01); H05K 1/0298 (2013.01); H05K 1/112 (2013.01); H05K 3/429 (2013.01); H05K 3/4644 (2013.01); H05K 3/0047 (2013.01); H05K 2201/09454 (2013.01); H05K 2201/09781 (2013.01); H05K 2203/0207 (2013.01)

(58) Field of Classification Search
CPC .... H05K 1/0251; H05K 3/4644; H05K 1/112; H05K 1/0298; H05K 1/0271; H05K 3/0047; H05K 3/429; H05K 2201/09454; H05K 2201/09781; H05K 2203/0207
USPC .................................................. 174/262–266
See application file for complete search history.

(56) References Cited

U.S. PATENT DOCUMENTS

| | | | | |
|---|---|---|---|---|
| 2004/0176938 | A1* | 9/2004 | Gisin | .................. G06F 17/5036 703/14 |
| 2006/0199390 | A1* | 9/2006 | Dudnikov, Jr. | ...... H05K 1/0257 438/700 |
| 2007/0091581 | A1* | 4/2007 | Gisin | ..................... H05K 1/023 361/782 |
| 2010/0064180 | A1* | 3/2010 | Farkas | ................. H05K 1/0251 714/45 |
| 2012/0312589 | A1* | 12/2012 | Balcome | ................ H05K 3/429 174/258 |
| 2014/0238733 | A1* | 8/2014 | Mutnury | ................ H05K 1/115 174/266 |
| 2015/0180104 | A1* | 6/2015 | Ao | ........................ H01P 1/2039 333/204 |

\* cited by examiner

*Primary Examiner* — Sherman Ng
(74) *Attorney, Agent, or Firm* — Kramer & Amado, P.C.

(57) ABSTRACT

Disclosed is a printed circuit board (PCB) having backdrill reliability anchors comprising nonfunctional pads to provide mechanical reinforcement for signal pads on backdrilled plated through hole (PTH) vias, as well as associated method and machine readable storage medium.

19 Claims, 3 Drawing Sheets

BACKDRILL RELIABILITY ANCHORS

PRIORITY

This application claims priority under 35 U.S.C. 119 to U.S. Provisional Application No. 62/078,150, entitled: "Backdrill Reliability Anchors" filed on Nov. 11, 2014, the contents of which are incorporated herein by reference.

This application also claims priority under 35 U.S.C. 119 to U.S. Provisional Application No. 62/079,947, entitled: "Backdrill Reliability Anchors" filed on Nov. 14, 2014, the contents of which are incorporated herein by reference.

FIELD OF INVENTION

The invention is directed to printed circuit board design and manufacturing.

BACKGROUND

Multi-layer printed circuit boards (PCBs) and backplanes typically use plated-through hole (PTH) vias to interconnect signal traces on different layers. Via stubs, where the PTH via extends unconnected past a signal trace, can introduce impedance mismatches at high frequencies. Backdrilling of these via stubs is becoming increasingly common place in the industry, to mitigate distortion of high speed digital signals. Backdrilling of thicker multilayer PCBs appears to introduce reliability or manufacturing yield problems. Therefore, improvements to reliability of backdrilled multilayer PCBs is highly desirable.

SUMMARY

A brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

Various exemplary embodiments relate to a multilayer printed circuit board (PCB). The multilayer PCB comprises: a plated through hole (PTH) via; a signal pad on a first internal layer electrically connected to the PTH via; an anchor pad on a second internal layer electrically connected to the PTH via, the anchor pad having no connection to a signal trace on the second internal layer, wherein the second internal layer proximate the first internal layer, and wherein said PTH via is configured to permit backdrilling a portion of said PTH via below said first layer and said second layer.

In various alternative embodiments, the second internal layer is within three layers of the first internal layer.

In various alternative embodiments, the second internal layer is adjacent to the first internal layer In various alternative embodiments, the second internal layer is above the first internal layer.

In various alternative embodiments, the second internal layer is below the first internal layer.

Various alternative embodiments comprise a plurality of the anchor pads.

In various alternative embodiments, the PTH via comprises a backdrilled portion below the first layer and the second layer.

Other embodiments provide a method for laying out a multilayer printed circuit board (PCB), for reinforcing a backdrilled via. The method comprises: laying out a plurality of signal layers; laying out a plated through hole (PTH) via; laying out a signal pad on a first internal layer electrically connected to the PTH via; laying out an anchor pad on a second internal layer electrically connected to the PTH via, the anchor pad having no connection to a signal trace on the second internal layer, wherein the second internal layer proximate the first internal layer; and laying out a backdrilled portion of the PTH via below the first layer and the second layer.

Other embodiments provide a tangible and non-transitory machine-readable storage medium encoded with instructions thereon for execution by a printed circuit board (PCB) layout tool, for laying out a multilayer PCB. The tool comprises a processor and memory, the machine-readable storage medium comprises instructions for: laying out a plurality of signal layers; laying out a plated through hole (PTH) via; laying out a signal pad on a first internal layer electrically connected to the PTH via; laying out an anchor pad on a second internal layer electrically connected to the PTH via, the anchor pad having no connection to a signal trace on the second internal layer, wherein the second internal layer proximate the first internal layer; and laying out a backdrilled portion of the PTH via below the first layer and the second layer.

BRIEF DESCRIPTION OF THE FIGURES

Some embodiments of apparatus and/or methods in accordance with embodiments of the present invention are now described, by way of example only, and with reference to the accompanying drawings in which.

In the figures, like features are denoted by like reference characters.

DETAILED DESCRIPTION

Reflow soldering of components onto a PCB can cause thermal expansion of the PCB substrate, across the thickness of the PCB (along the z-axis). The thicker the PCB, the greater the expansion. PTH vias through the thickness of the PCB appear to provide mechanical support to control stresses.

When PTH vias are backdrilled, the mechanical support is reduced, and failures have been observed that are linked to internal trace separation as a result of shear stresses generated by dielectric z-axis expansion during assembly reflow. That is, separation of a signal line from the barrel of a via which has been backdrilled. This problem can be exacerbated as reflow temperatures are increased, for example to accommodate lead-free solder and can also be exacerbated with increased PCB thickness to accommodate more signal layers. It is not uncommon to have as many as 40 signal layers in complex PCBs.

This problem can be mitigated by adding sacrificial/non-functional anchor pads just above the signal layer targeted by the backdrill. These pads share the expansion stresses that would normally be born solely by the signal pad, thereby greatly decreasing the likelihood that shear stresses would exceed shear strength of the connection between an internal signal pad and a PTH via barrel. This technique can minimally involve one additional pad above the target layer, but could also include multiple pads of lesser thickness or even be targeted to layers of greater thickness.

The impact of these additional (electrically) non-functional anchor pads on critical high speed circuits can be minimized by appropriate tuning of the design of the circuit trace layout to minimize the effects of their presence. For example, the effect of the additional anchor pads on return loss can be minimized with larger antipads in the adjacent plane layers (clearances around these anchor pads on the adjacent plane layers). It is contemplated that design rules may take advantage of this, as would be recognized by persons of skill in the art.

Figure 1:
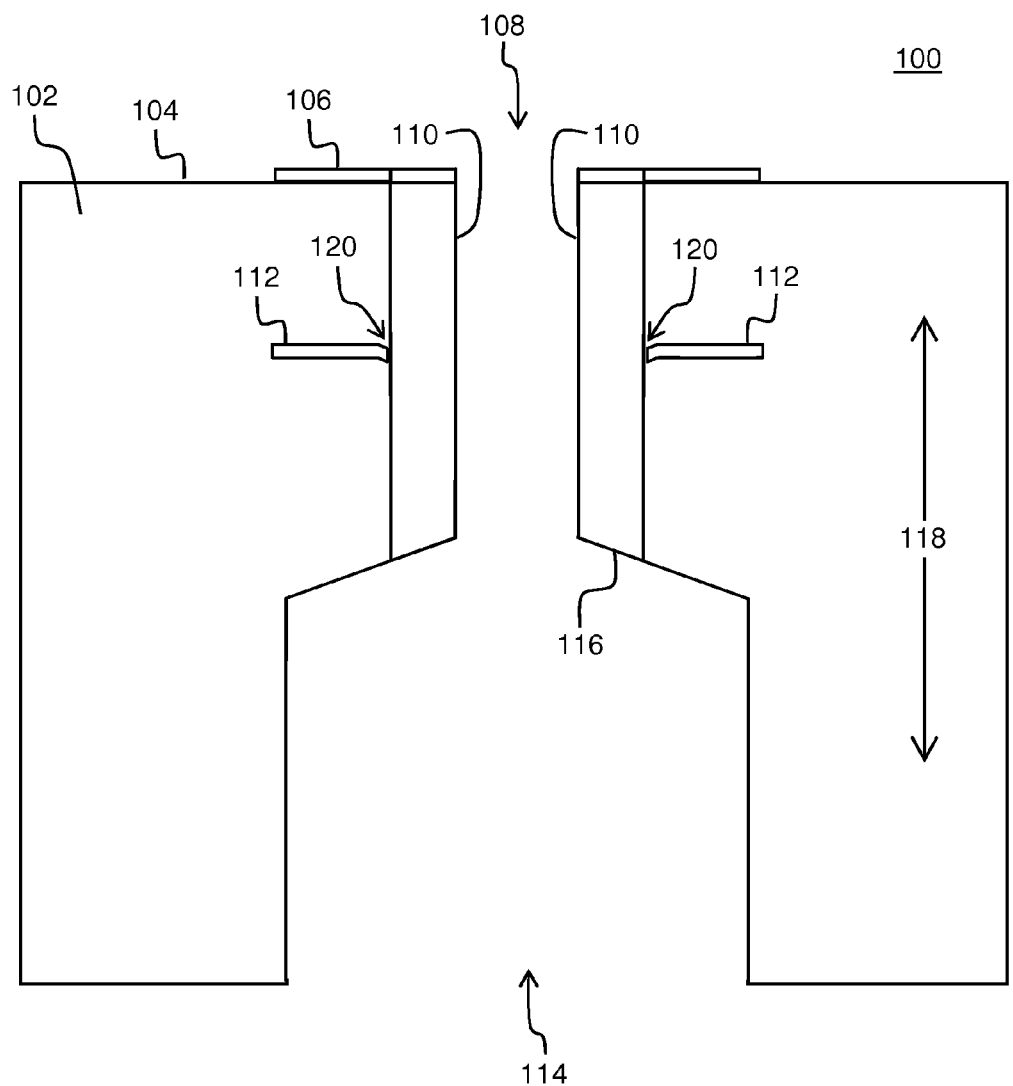
FIG. 1 illustrates a cross section view of a prior art backdrilled via.

FIG. 1 illustrates a cross section view 100 of a portion of a multilayer PCB 102 having a top surface 104, a signal pad 106 on the top surface 104, plated through hole via 108 with a conductive barrel 110 and a backdrilled portion 114 resulting in the via subsurface end 116 terminating proximate to signal pad 112. When conductive barrel 110 is formed by plating through via 108, to create plated through hole (PTH) via, an electrical and mechanical connection is made with signal pad 112. During the reflow solder process for assembling components to the PCB 102, thermal expansion of the substrate of PCB 102 along the Z-axis 118, can cause signal pad 112 to separate from the conductive barrel 110 due to shear stresses at the junction 120.

Figure 2:
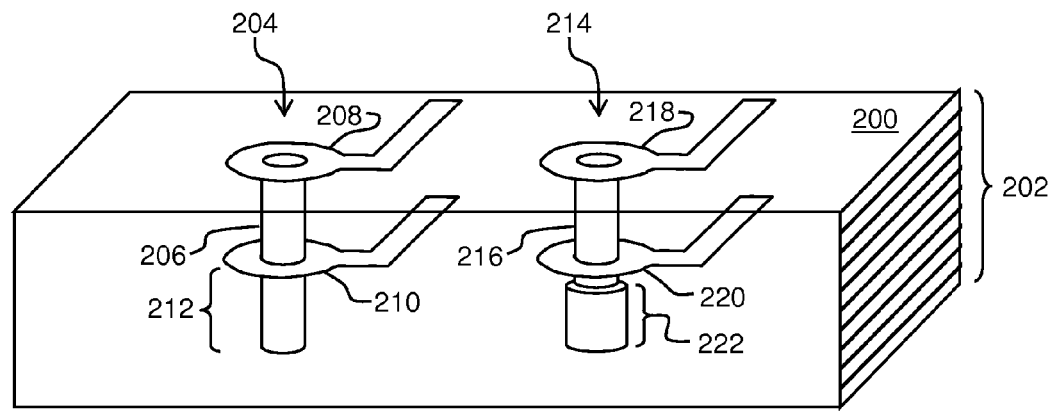
FIG. 2 illustrates an oblique view of a prior art backdrilled via in a multilayer printed circuit board.

FIG. 2 illustrates an oblique view of a PCB 200 having multiple layers 202. PTH via 204 illustrates a via barrel 206 connecting signal pad 208 on the top surface of PCB 200 to signal pad 210 located on an internal layer of PCB 200. The remaining via stub 212 does not carry signal current between signal pads 208 and 210 but can cause distortion of high frequency signals. This can be mitigated as illustrated by PTH via 214 where the via stub is backdrilled 222. It is in this scenario that reliability problem can be introduced as described previously.

Figure 3:
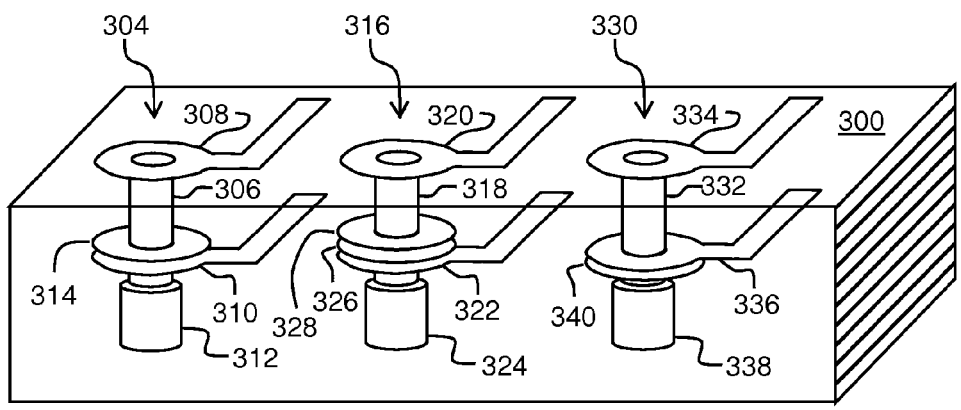
FIG. 3 illustrates an oblique view of embodiments of backdrilled via anchor pads.

FIG. 3 illustrates multilayer PCB 300 with various embodiments of backdrill reliability anchor pads. PTH via 304 has conductive barrel 306 connecting signal pad 308 to signal pad 310, and with backdrilled portion 312, similarly to PTH via 214 but with the addition of reliability anchor pad 314 located on an internal layer adjacent to and above the internal layer of signal pad 310.

For example, signal pad 310 could be at layer 21 of a 26 layer PCB. Via 304 connects signal pad 308 on the top layer of the PCB 300 to signal pad 310 on internal layer 21. Conductive barrel 306 of via 304 would need to be backdrilled to layer 23 to create backdrilled portion 312, in order to eliminate the via stub that would otherwise affect high frequency signals. Anchor pad 314 is an (electrically) non-functional pad located at layer 20. Anchor pad 314 is for example, is a typical signal pad +0.010" larger than via barrel 306, but with no connection to a signal trace on that layer.

PTH via 316 illustrates an embodiment with reliability anchor pads 326 and 328 located on internal layers above the internal layer of signal pad 322.

PTH via 330 illustrates an embodiment with reliability anchor pad 340 located on an internal layer adjacent to and below the internal layer of signal pad 336.

A principle of the reliability anchor pad is to provide additional mechanical support for the connection between the conductive barrel and the signal pad, in order to share the load of mechanical stresses due to thermal expansion. One or more anchor pads can be used above and/or below the lower signal pad. These anchor pads are electrically non-functional from a circuit perspective and are intended to provide mechanical support.

The layer on which the anchor pad(s) is added may be selectively biased to layers that have greater copper weight (thickness). Hence it is contemplated that adding an anchor pad on layer n+3 may be preferred to adding a anchor pad on n+1, where the nominal copper thickness of layer n+3 is greater than that of layer n+1. Most PCB stackups are composed of 0.5 oz (0.0006"), 1.0 oz (0.0012") and 2 oz (0.0025") layers, so these thickness options are already present in most designs. It is contemplated that design rules may take advantage of this.

Embodiments include layout files for laying out PCBs using anchor pads as described. Such a layout file can be stored in a machine-readable storage medium for execution by a PCB layout tool as is well known by a person of skill in the art.

Figure 4:
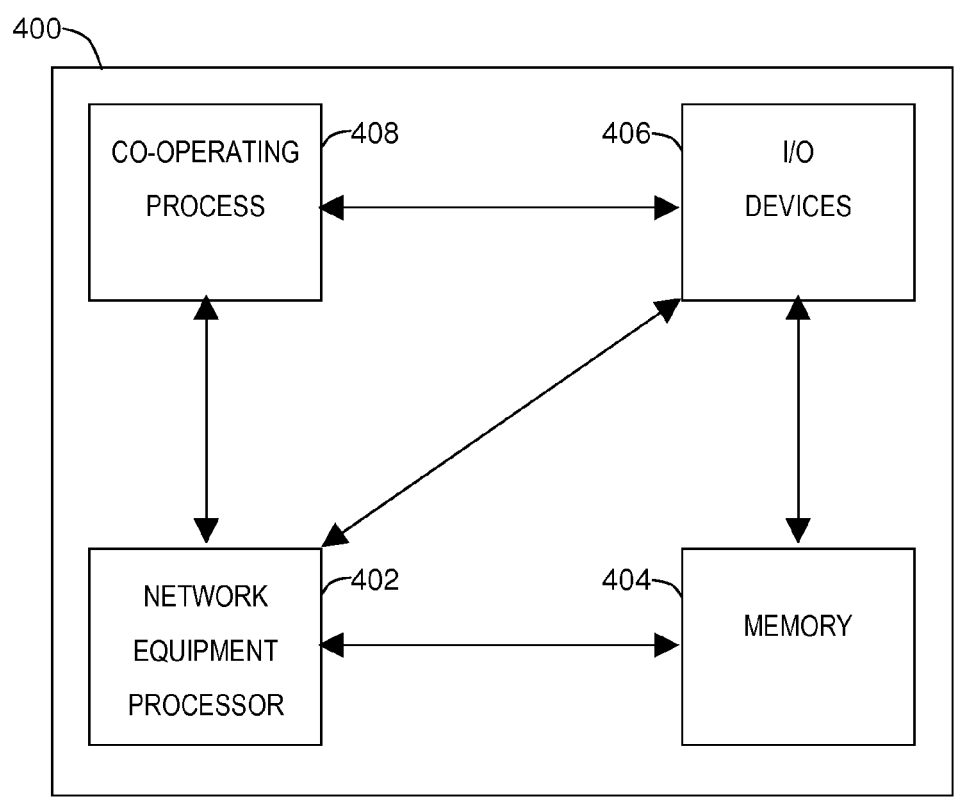
FIG. 4 illustrates high-level block diagram of a processor assembly suitable for embodiments.

FIG. 4 depicts a high-level block diagram of a processor assembly suitable for use in performing functions described herein.

As depicted in FIG. 4, processor assembly 400 includes a processor element 402 (e.g., a central processing unit (CPU) and/or other suitable processor(s)), a memory 404 (e.g., random access memory (RAM), read only memory (ROM), and the like), a cooperating module/process 408, and various input/output devices 406 (e.g., a user input device (such as a keyboard, a keypad, a mouse, and the like), a user output device (such as a display, a speaker, and the like), an input port, an output port, a receiver, a transmitter, and storage devices (e.g., a tape drive, a floppy drive, a hard disk drive, a compact disk drive, and the like)).

It will be appreciated that the functions depicted and described herein may be implemented in hardware, for example using one or more application specific integrated circuits (ASIC), and/or any other hardware equivalents. Alternatively, according to one embodiment, the cooperating process 408 can be loaded into memory 404 and executed by network equipment processor 402 to implement the functions as discussed herein. As well, cooperating process 408 (including associated data structures) can be stored on a tangible, non-transitory computer readable storage medium, for example magnetic or optical drive or diskette, semiconductor memory and the like.

It is contemplated that some of the steps discussed herein as methods may be implemented within hardware, for example, as circuitry that cooperates with the network equipment processor to perform various method steps. Portions of the functions/elements described herein may be implemented as a computer program product wherein computer instructions, when processed by a network equipment processor, adapt the operation of the network equipment processor such that the methods and/or techniques described herein are invoked or otherwise provided. Instructions for invoking the inventive methods may be stored in fixed or removable media, and/or stored within a memory within a computing device operating according to the instructions.

The functions of the various elements shown in the figures, including any functional blocks labeled as "processors", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

It should also be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

It should be appreciated by those skilled in the art that any block diagrams herein represent conceptual views of illustrative circuitry embodying the principles of the invention. Numerous modifications, variations and adaptations may be made to the embodiment of the invention described above without departing from the scope of the invention, which is defined in the claims.

What is claimed is:

1. A multilayer printed circuit board (PCB), said multilayer PCB comprising:
    a plated through hole (PTH) via;
    a signal pad on a first internal layer electrically connected to said PTH via;
    an anchor pad on a second internal layer electrically connected to said PTH via, said anchor pad having no connection to a signal trace on said second internal layer,
    wherein said second internal layer is proximate said first internal layer,
    wherein said PTH via comprises a backdrilled portion below said first layer and said second layer,
    wherein the first internal layer is a lowermost signal pad internal layer above said backdrilled portion, and
    wherein said second internal layer is disposed between said first internal layer and said backdrilled portion.

2. The PCB of claim 1, wherein said second internal layer is within three layers of said first internal layer.

3. The PCB of claim 1, wherein said second internal layer is adjacent to said first internal layer.

4. The PCB of claim 1, comprising a plurality of said anchor pads.

5. The PCB of claim 1, wherein the first internal layer has first thickness and the second internal layer has a second thickness, the second thickness being greater than the first thickness.

6. The PCB of claim 1, wherein the first internal layer has a first copper weight and the second internal layer has a second copper weight, the second copper weight being greater than the first copper weight.

7. A method for laying out a multilayer printed circuit board (PCB), for reinforcing a backdrilled via, the method comprising:
    laying out a plurality of signal layers;
    laying out a plated through hole (PTH) via;
    laying out a signal pad on a first internal layer electrically connected to said PTH via;
    laying out an anchor pad on a second internal layer electrically connected to said PTH via, said anchor pad having no connection to a signal trace on said second internal layer, wherein said second internal layer proximate said first internal layer;
    laying out a backdrilled portion of said PTH via below said first layer and said second layer;
    laying out the first internal layer as a lowermost signal pad internal layer above said backdrilled portion; and
    laying out said second internal layer disposed between said first internal layer and said backdrilled portion.

8. The method of claim 7, wherein said second internal layer is within three layers of said first internal layer.

9. The method of claim 7, wherein said second internal layer is adjacent to said first internal layer.

10. The method of claim 7, comprising laying out a plurality of said anchor pads.

11. The method of claim 7, wherein the first internal layer has first thickness and the second internal layer has a second thickness, the second thickness being greater than the first thickness.

12. The method of claim 7, wherein the first internal layer has a first copper weight and the second internal layer has a second copper weight, the second copper weight being greater than the first copper weight.

13. A tangible and non-transitory machine-readable storage medium encoded with instructions thereon for execution by a printed circuit board (PCB) layout tool, for laying out a multilayer PCB, said tool comprising a processor and memory, said machine-readable storage medium comprising instructions for:
    laying out a plurality of signal layers;

laying out a plated through hole (PTH) via;

laying out a signal pad on a first internal layer electrically connected to said PTH via;

laying out an anchor pad on a second internal layer electrically connected to said PTH via, said anchor pad having no connection to a signal trace on said second internal layer, wherein said second internal layer proximate said first internal layer;

laying out a backdrilled portion of said PTH via below said first layer and said second layer;

laying out the first internal layer as a lowermost signal pad internal layer above said backdrilled portion; and laying out said second internal layer disposed between said first internal layer and said backdrilled portion.

14. The machine-readable storage medium of claim 13, wherein said second internal layer is within three layers of said first internal layer.

15. The machine-readable storage medium of claim 13, wherein said second internal layer is adjacent to said first internal layer.

16. The machine-readable storage medium of claim 15, wherein said second internal layer is below said first internal layer.

17. The machine-readable storage medium of claim 13, comprising a plurality of said anchor pads.

18. The machine-readable storage medium of claim 13, wherein the first internal layer has first thickness and the second internal layer has a second thickness, the second thickness being greater than the first thickness.

19. The machine-readable storage medium of claim 13, wherein the first internal layer has a first copper weight and the second internal layer has a second copper weight, the second copper weight being greater than the first copper weight.

* * * * *